(12) United States Patent
Qiao et al.

(10) Patent No.: US 12,137,521 B2
(45) Date of Patent: Nov. 5, 2024

(54) MULTILAYER CIRCUIT BOARD

(71) Applicant: 3M INNOVATIVE PROPERTIES COMPANY, St. Paul, MN (US)

(72) Inventors: YunLong Qiao, Bukit Timah (SG); Saujit Bandhu, Sengkang (SG); Kok Hoe Lee, Geylang (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 150 days.

(21) Appl. No.: 17/800,362

(22) PCT Filed: Feb. 24, 2021

(86) PCT No.: PCT/IB2021/051550
§ 371 (c)(1),
(2) Date: Aug. 17, 2022

(87) PCT Pub. No.: WO2021/171200
PCT Pub. Date: Sep. 2, 2021

(65) Prior Publication Data
US 2023/0100232 A1 Mar. 30, 2023

Related U.S. Application Data

(60) Provisional application No. 62/982,268, filed on Feb. 27, 2020.

(51) Int. Cl.
*H05K 1/11* (2006.01)
(52) U.S. Cl.
CPC .............. *H05K 1/117* (2013.01); *H05K 1/113* (2013.01); *H05K 2201/09145* (2013.01); *H05K 2201/10189* (2013.01)
(58) Field of Classification Search
CPC ................... H05K 1/117; H05K 1/113; H05K 2201/09145; H05K 2201/10189
(Continued)

(56) References Cited

U.S. PATENT DOCUMENTS 6,083,340 A * 7/2000 Nomura ............... H05K 3/4069
156/278
11,109,480 B2 8/2021 Miyazaki et al.
(Continued)

FOREIGN PATENT DOCUMENTS

CN 205071465 U 3/2016
JP 07297558 A 11/1995
JP 2019134092 A 8/2019

OTHER PUBLICATIONS

International Search Report for PCT International Application No. PCT/IB2021/051550, mailed on Apr. 27, 2021, 3 pages.

*Primary Examiner* — Andargie M Aychillhum
(74) *Attorney, Agent, or Firm* — Jonathan L. Tolstedt

(57) ABSTRACT

A multilayer circuit board includes an upper surface and an opposing lower surface. An electrically insulating layer is disposed between the upper and lower surfaces. A plurality of electrically conductive upper and lower rear pads are disposed proximate a rear edge on the respective upper and lower surfaces for termination of a plurality of wires. The upper and lower rear pads include respective upper and lower rear ground pads substantially aligned with each other and configured for termination of ground wires. A plurality of electrically conductive front pads are disposed proximate a front edge for insertion into a connector and electrically connected to the upper and lower rear pads. An electrically conductive via extends from the upper rear ground pad to the lower rear ground pad and makes electrical and physical contact with each of the upper and lower rear ground pads.

10 Claims, 5 Drawing Sheets

(58) Field of Classification Search
USPC .......................................................... 174/261
See application file for complete search history.

(56) References Cited

U.S. PATENT DOCUMENTS

| | | | | |
|---|---|---|---|---|
| 2011/0195593 | A1* | 8/2011 | McGrath | H01R 13/6471 |
| | | | | 439/607.41 |
| 2013/0264107 | A1* | 10/2013 | Meyers | H01R 13/6466 |
| | | | | 174/268 |
| 2020/0112115 | A1* | 4/2020 | Vana, Jr. | H05K 1/117 |

* cited by examiner

MULTILAYER CIRCUIT BOARD

CROSS REFERENCE TO RELATED APPLICATIONS

This application is a national stage filing under 35 U.S.C. 371 of PCT/IB2021/051550, filed Feb. 24, 2021, which claims the benefit of Provisional Application No. 62/982,268, filed Feb. 27, 2020, the disclosures of which are incorporated by reference in their entireties herein.

TECHNICAL FIELD

The present disclosure generally relates to printed circuit boards, and particularly to multilayer circuit boards.

BACKGROUND

It is known that a printed circuit board (PCB) connector provides a connectable interface between the PCB and another device with a complementary mating connector. A PCB connector may be mounted on a PCB in many ways; directly soldering the PCB connector to a conductive pad on a surface of the PCB is one of them. The soldering fixes the connector to the top of the soldering pads of the PCB. Any movement of the cable will be translated to the pads on the PCB. Quad small form-factor pluggable (QSFP) is a widely used PCB for data center external 10 connection applications. As the industry is moving toward a higher data rate per cable, the quad small form-factor pluggable double density (QSFP-DD) interface and octal small form-factor pluggable (OSFP) interface have been introduced to carry double the data capacity of a QSFP cable assembly.

SUMMARY

Some aspects of the disclosure relate to a multilayer circuit board extending along a first direction between opposite front and rear edges of the circuit board. The circuit board includes an upper surface and an opposing lower surface. An electrically insulating layer is disposed between the upper and lower surfaces. A plurality of electrically conductive upper and lower rear pads is disposed proximate the rear edge on the respective upper and lower surfaces for termination of a plurality of wires thereto. The upper and lower rear pads include respective upper and lower rear ground pads substantially aligned with each other and configured for termination of ground wires thereto. A plurality of electrically conductive front pads is disposed proximate the front edge for insertion into a connector and electrically connected to the upper and lower rear pads. An electrically conductive via extends from the upper rear ground pad to the lower rear ground pad and makes electrical and physical contact with each of the upper and lower rear ground pads.

Some aspects of the disclosure relate to a circuit board including electrically conductive first and second pads spaced apart in a thickness direction of the circuit board and substantially aligned with each other. The first and second pads are adapted for electrical and physical termination of wires thereto. An electrically insulating layer is disposed between the first and second pads. A plurality of electrically conductive vias extends substantially orthogonally through the first and second pads. An electrically conductive material substantially fills each via and extends over, and makes electrical and physical contact with, a portion of a top surface of each of the first and second pads.

Other aspects of the disclosure relate to a circuit board including electrically conductive first and second pads formed on spaced apart respective first and second major surfaces of the circuit board. The first and second pads are substantially aligned with each other and adapted for electrical and physical termination of wires thereto. At least one electrically conductive via prevents separation of the first and second pads from the circuit board by extending substantially orthogonally between, and making electrical and physical contact with, the first and second pads.

These and other aspects of the present application will be apparent from the detailed description below. In no event, however, should the above summaries be construed as limitations on the claimed subject matter, which subject matter is defined solely by the attached claims.

BRIEF DESCRIPTION OF DRAWINGS

The various aspects of the disclosure will be discussed in greater detail with reference to the accompanying figures where, FIGS. 1-2 schematically show different views of a circuit board according to some aspects of the disclosure.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

In the following detailed description, reference is made to the accompanying drawings that form a part hereof, and in which are shown by way of illustration several specific embodiments. It is to be understood that other embodiments are contemplated and may be made without departing from the scope or spirit of the present disclosure.

A multilayer circuit board is a circuit board made up of a large number of wiring layers laminated with insulation layers interposed therebetween. Various electronic parts and a connector are mounted at predetermined positions of the multilayer circuit board. Each layer of the multilayer circuit board carries electrical connections, or conductive traces, which act as wires and are used to interconnect various components of the circuit. The conductive traces are bonded to, or otherwise incorporated into, an insulating substrate which mechanically supports the components. The substrate may be flexible or rigid and may be fabricated from any suitable material, for example polymers, ceramics, glasses, silicon, etc.

As the industry moves toward higher data rate per cable, higher grade of dielectric materials having lower adhesion to copper pads are used as PCB insulation base materials. If the retention force between the soldered copper pads fixed on the base material of the PCB is not strong enough, any movement of the cable conductor after the soldering process may cause the copper pads to lift up from the base material of the PCB, thereby causing connection problems. The present disclosure addresses these and other challenges.

Embodiments disclosed herein relate to improving the retention of the conductive pads with the insulation base material of the PCB by providing additional holding features to the soldered conductive pads.

Figure 1:
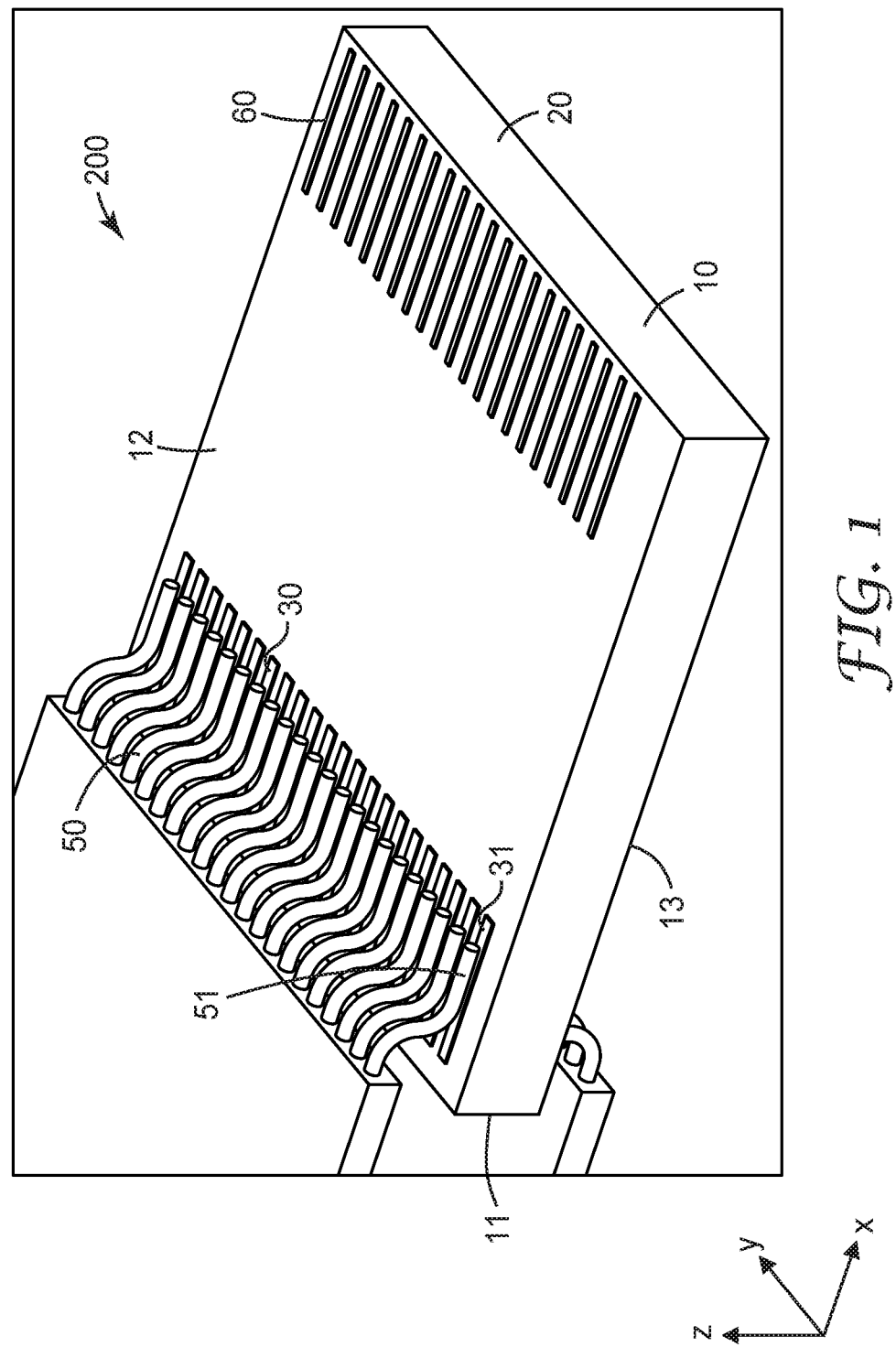
Figure 2:
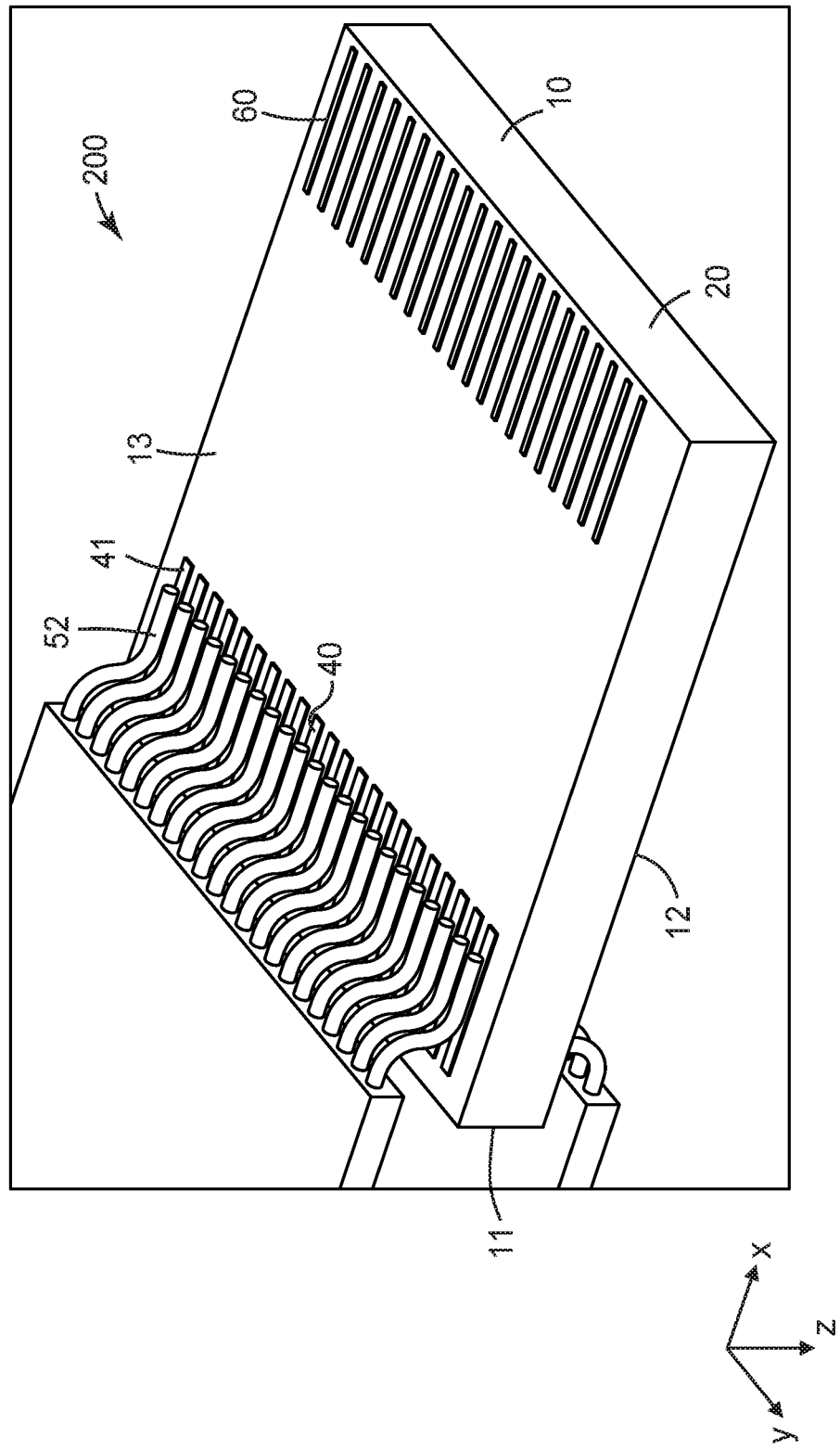

In some embodiments as shown in FIGS. 1 and 2, a multilayer circuit board (200) includes an upper surface (12) and an opposing lower surface (13). The upper and lower surfaces (12, 13) form respective first and second major surfaces of the circuit board (200) and are spaced apart from each other. In some aspects, an electrically insulating layer (20) may be disposed between the upper (12) and lower (13) surfaces. The circuit board (200) extends along a first direction (x-axis) between opposite front (10) and rear (11) edges of the circuit board. The circuit board includes electrically conductive first pads (31) and second pads (41) spaced apart in a thickness direction (z-axis) of the circuit board. The first (31) and second (41) pads are substantially aligned with each other and are formed on spaced apart respective first (12) and second (13) major surfaces of the circuit board. In some aspects, an electrically insulating layer (20) may be disposed between the first and second pads (31, 41). The first and second pads (31, 41) are adapted for electrical and physical termination of wires (50) thereto.

In other embodiments, a plurality of electrically conductive upper rear pads (30) may be disposed proximate the rear edge (11) on the upper surface (12) and a plurality of electrically conductive lower rear pads (40) may be disposed proximate the rear edge (11) on the lower surface (13). The upper and lower rear pads (30, 40) are adapted for termination of a plurality of wires (50) thereto. The upper and lower rear pads (30, 40) may include respective upper (31) and lower (41) rear ground pads substantially aligned with each other and configured for termination of ground wires (51, 52) thereto. In some instances, the ground wires may be soldered to the rear pads (30, 40) in order to fix the wires on top of the rear pads of the circuit board. Suitable solder pastes may be used for the soldering process.

The circuit board (200) may further includes a plurality of electrically conductive front pads (60) disposed proximate the front edge (10) of the circuit board. The plurality of electrically conductive front pads (60) may be electrically connected to the upper and lower rear pads and configured for insertion into a connector. In some cases, the multilayer circuit board (200) may be configured to be used in octal small form-factor pluggable (OSFP) connectors. In other cases, the multilayer circuit board (200) may be configured to be used in quad small form-factor pluggable (QSFP) or quad small form-factor pluggable double density (QSFP-DD) connectors. In some instances, for example in an OSFP PCB, the plurality of electrically conductive front pads (60) form a row of front pads on an upper surface (12) of the PCB and a row of front pads on a lower surface (13) of the PCB. The multilayer circuit board may include a plurality of pairs of traces extending between and connecting the front pads (60) to the rear pads (30, 40). Each pair of traces may be configured to transmit a differential signal, and each trace of the pair carries one of the components of the differential signal as described elsewhere.

Figure 3:
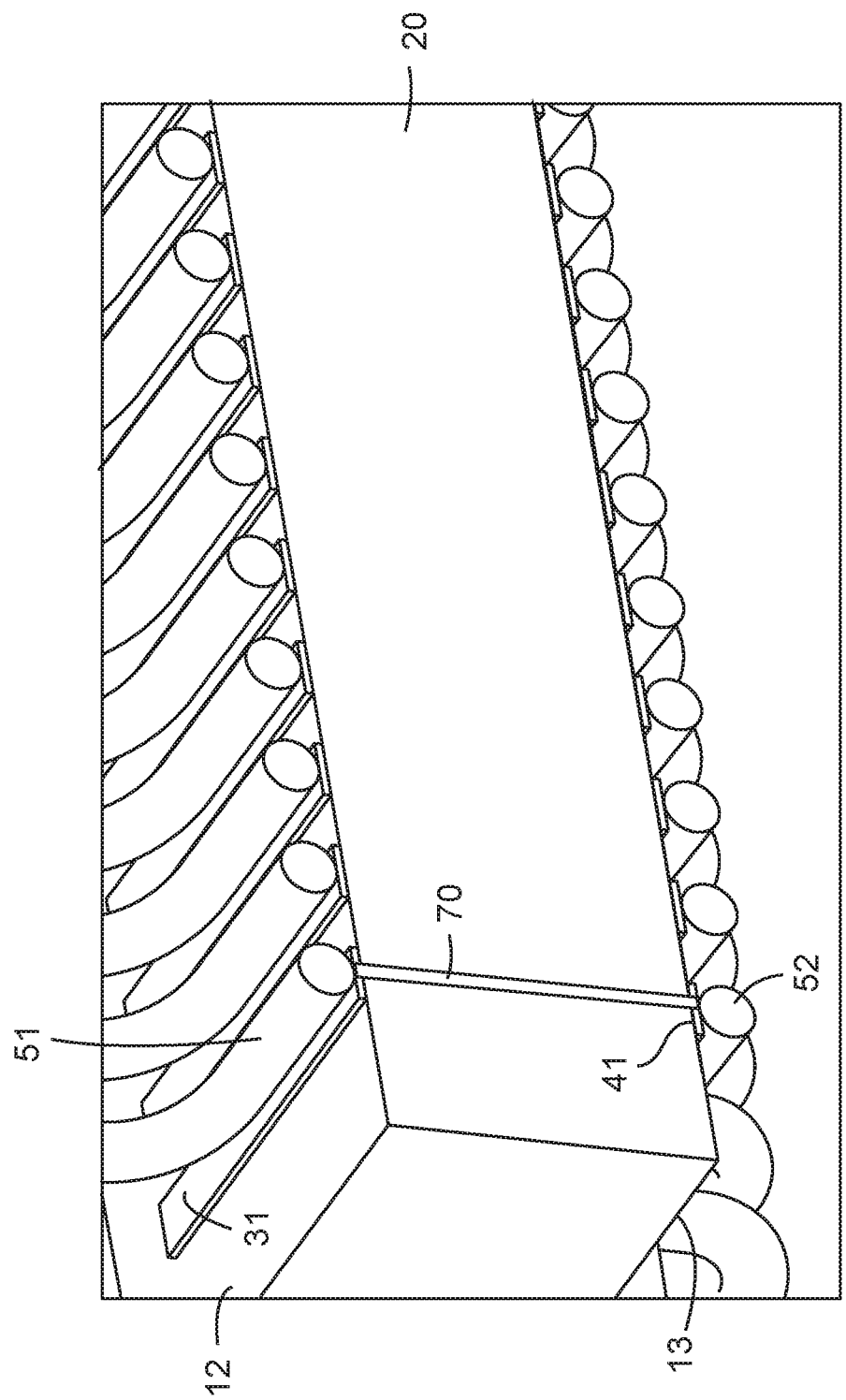
FIG. 3 schematically shows a partial cross sectional view of the circuit board according to some aspects of the disclosure.

In some embodiments as shown in FIG. 3, an electrically conductive via (70) extends from the upper rear ground pad (31) to the lower rear ground pad (41). The electrically conductive via (70) makes electrical and physical contact with each of the upper and lower rear ground pads (31, 41). In some instances, the electrically conductive via may be created by forming a hole (by drilling, for example) in the thickness direction (z-axis) through the entire thickness of the circuit board to make the electrical and physical contact with each of the upper and lower rear ground pads (31, 41). Via holes may be drilled in appropriate locations on the circuit board to interconnect the rear pads on successive layers. The electrically conductive via (70) holds the upper and lower rear ground pads securely to the respective upper and lower surfaces of the circuit board and increases the retention of the rear pads with the upper and lower surface of the circuit board.

Figure 4:
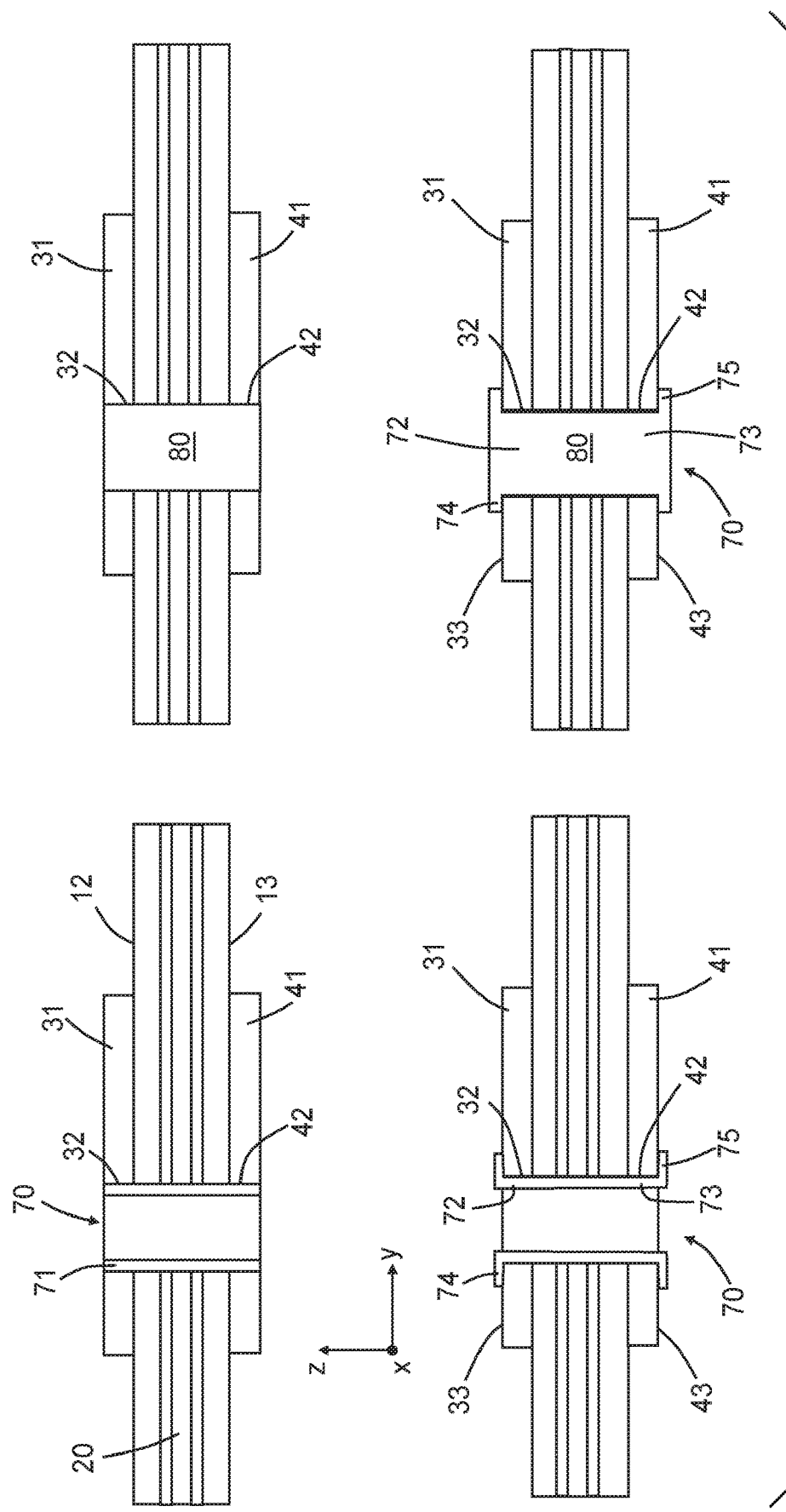
FIG. 4 schematically shows different embodiments of the conductive via extending between upper and lower ground pads of the circuit board.

Different aspects of the via (70) are shown in FIG. 4. In some aspects, the electrically conductive via (70) includes an electrically conductive wall (71) making electrical and physical contact with each of the upper and lower rear ground pads (31, 41). In other aspects, the electrically conductive via (70) exposes a side surface (32, 42) of each of the upper and lower rear ground pads (31, 41). The electrically conductive via (70) makes electrical and physical contact with the exposed side surface (32, 42) of each of the upper and lower rear ground pads (31, 41). For instance, the electrical contact with the exposed side surface (32, 42) may be achieved by applying a conductive material to the walls (71) of the via (70). The conductive material may be applied to the wall (71) by vapor deposition and/or electroplating techniques.

In some other aspects, the electrically conductive via (70) may include first portions (72, 73) and second portions (74, 75). The first portions (72, 73) makes electrical and physical contact with the exposed side surfaces (32, 42) of the upper and lower rear ground pads. The second portions (74, 75) extend over and make electrical and physical contact with top surfaces (33, 43) of the upper and lower rear ground pads.

Figure 5A:
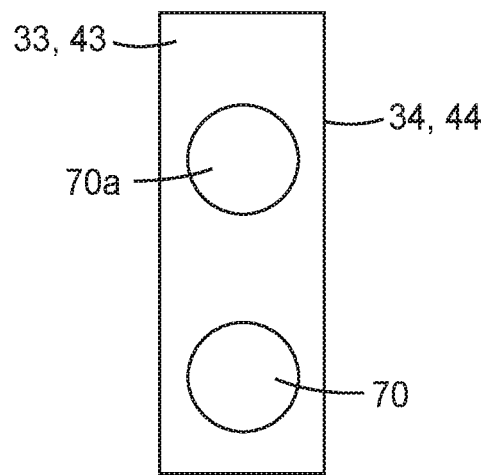
FIG. 5A & 5B schematically show different positions of the vias making contact with the top surfaces of the ground pads of the circuit board.
Figure 5B:
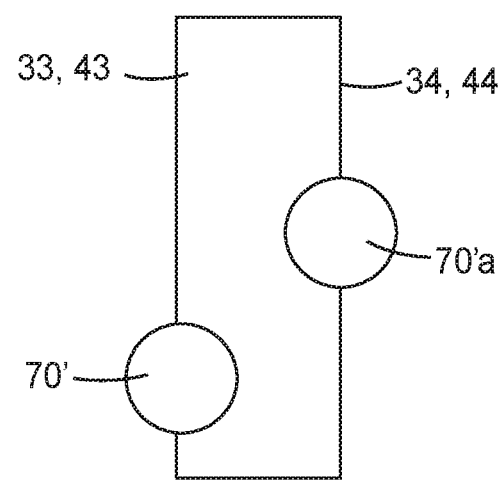

In other aspects, an electrically conductive material (80) may substantially or partially fill the via (70) and makes electrical and physical contact with each of the upper and lower rear ground pads (31, 41). The electrically conductive material (80) may extend over and make electrical and physical contact with top surfaces (33, 43) of the upper and lower rear ground pads (31, 41). In some aspects, as best shown in FIG. 5A, the electrically conductive via (70, 70a) may be entirely enclosed within a perimeter (34, 44) of at least one of the upper and lower rear ground pads. In some other aspects, as best shown in FIG. 5B, the electrically conductive via (70', 70'a) intersects a perimeter (34, 44) of at least one of the upper and lower rear ground pads.

In some embodiments, a plurality of electrically conductive vias (70, 70a) may extend substantially orthogonally through the first and second pads (31, 41) as schematically shown in FIG. 5A. In some other embodiments, each electrically conductive via (70', 70'a) may intersect a perimeter (34, 44) of each one of the first and second pads (31, 41) as shown in FIG. 5B.

At least one electrically conductive via (70) prevents separation of the first and second pads (31, 41) from the circuit board (200) by extending substantially orthogonally between, and making electrical and physical contact with, the first and second pads. An electrically conductive material (80) substantially or partially fills each via and extends over and makes electrical and physical contact with a portion of a top surface (33, 43) of each of the first and second pads (31, 41). In some aspects, at least one electrically conductive via (70) prevents separation of the first and second pads (31, 41) from the circuit board (200) by virtue of being at least partially filled with the electrically conductive material (80) that extends over a portion of a top surface (33, 43) of each of the first and second pads (31, 41). The at least one electrically conductive via (70) holds the first and second pads (31, 41) securely to the respective upper and lower surfaces (12, 13) of the circuit board and increases the retention of the pads with the upper and lower surface of the circuit board.

Although specific embodiments have been illustrated and described herein, it will be appreciated by those of ordinary skill in the art that a variety of alternate and/or equivalent implementations can be substituted for the specific embodiments shown and described without departing from the scope of the present disclosure.

The invention claimed is:

1. A multilayer circuit board extending along a first direction between opposite front and rear edges of the circuit board and comprising:
   an upper surface and an opposing lower surface;
   an electrically insulating layer disposed between the upper and lower surfaces;
   a plurality of electrically conductive upper and lower rear pads disposed proximate the rear edge on the respective upper and lower surfaces for termination of a plurality of wires thereto, the upper and lower rear pads comprising respective upper and lower rear ground pads substantially aligned with each other and configured for termination of ground wires thereto;
   a plurality of electrically conductive front pads disposed proximate the front edge for insertion into a connector and electrically connected to the upper and lower rear pads; and
   an electrically conductive via extending from the upper rear ground pad to the lower rear ground pad and making electrical and physical contact with each of the upper and lower rear ground pads, wherein the electrically conductive via prevents separation of the upper rear ground pad and the lower rear ground pad from the multiplayer circuit board by extending substantially orthogonally between, and making electrical and physical contact with, the upper rear ground pad and the lower rear ground pad.

2. The multilayer circuit board of claim 1, wherein the electrically conductive via comprises an electrically conductive wall making electrical and physical contact with each of the upper and lower rear ground pads, and wherein the electrically conductive via exposes, and makes electrical and physical contact with, a side surface of each of the upper and lower rear ground pads.

3. The multilayer circuit board of claim 1, wherein the electrically conductive via exposes a side surface of each of the upper and lower rear ground pads, and wherein first portions of the electrically conductive via make electrical and physical contact with the exposed side surfaces of the upper and lower rear ground pads and second portions of the electrically conductive via extend over and make electrical and physical contact with top surfaces of the upper and lower rear ground pads.

4. The multilayer circuit board of claim 1, wherein the electrically conductive via intersects a perimeter of at least one of the upper and lower rear ground pads.

5. The multilayer circuit board of claim 1, wherein the electrically conductive via is entirely enclosed within a perimeter of at least one of the upper and lower rear ground pads.

6. The multilayer circuit board of claim 5, wherein the electrically conductive material extends over and makes electrical and physical contact with top surfaces of the upper and lower rear ground pads.

7. A circuit board comprising:
   electrically conductive first and second pads spaced apart in a thickness direction of the circuit board and substantially aligned with each other, the first and second pads adapted for electrical and physical termination of wires thereto;
   an electrically insulating layer disposed between the first and second pads; and
   a plurality of electrically conductive vias extending substantially orthogonally through the first and second pads, an electrically conductive material substantially filling each via and extending over, and making electrical and physical contact with, a portion of a top surface of each of the first and second pads.

8. The circuit board of claim 7, wherein each electrically conductive via intersects a perimeter of each one of the first and second pads.

9. A circuit board comprising:
   electrically conductive first and second pads formed on spaced apart respective first and second major surfaces of the circuit board, the first and second pads substantially aligned with each other and adapted for electrical and physical termination of wires thereto, wherein at least one electrically conductive via prevents separation of the first and second pads from the circuit board by extending substantially orthogonally between, and making electrical and physical contact with, the first and second pads.

10. The circuit board of claim 9, wherein the at least one electrically conductive via prevents separation of the first and second pads from the circuit board by virtue of being at least partially filled with an electrically conductive material that extends over a portion of a top surface of each of the first and second pads.

\* \* \* \* \*

UNITED STATES PATENT AND TRADEMARK OFFICE
CERTIFICATE OF CORRECTION

PATENT NO. : 12,137,521 B2
APPLICATION NO. : 17/800362
DATED : November 5, 2024
INVENTOR(S) : YunLong Qiao et al.

Page 1 of 1

It is certified that error appears in the above-identified patent and that said Letters Patent is hereby corrected as shown below:

In the Claims

<u>Column 5</u>
Line 36, In Claim 1, delete "multiplayer circuit board" and insert -- multilayer circuit board --, therefor.

Signed and Sealed this
Twenty-fifth Day of March, 2025

Coke Morgan Stewart
*Acting Director of the United States Patent and Trademark Office*